(12) United States Patent
Laven et al.

(10) Patent No.: US 10,200,028 B2
(45) Date of Patent: Feb. 5, 2019

(54) ELECTRIC ASSEMBLY INCLUDING A REVERSE CONDUCTING SWITCHING DEVICE AND A RECTIFYING DEVICE

(71) Applicant: Infineon Technologies AG, Neubiberg (DE)

(72) Inventors: Johannes Georg Laven, Taufkirchen (DE); Roman Baburske, Otterfing (DE); Thomas Basler, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/497,290

(22) Filed: Apr. 26, 2017

(65) Prior Publication Data

US 2017/0338815 A1   Nov. 23, 2017

(30) Foreign Application Priority Data

May 19, 2016   (DE) .................. 10 2016 109 235

(51) Int. Cl.
*H03K 17/567* (2006.01)
*H01L 29/16* (2006.01)
(Continued)

(52) U.S. Cl.
CPC ......... *H03K 17/567* (2013.01); *H01L 25/072* (2013.01); *H01L 29/0619* (2013.01);
(Continued)

(58) Field of Classification Search
CPC ... H01L 29/1608; H01L 29/417; H01L 29/47; H01L 29/7392; H01L 29/8611; H01L 29/872; H03K 17/567
(Continued)

(56) References Cited

U.S. PATENT DOCUMENTS 5,696,396 A   12/1997  Tokura et al.
5,737,165 A *  4/1998  Becker .................. H04L 1/24
                                              361/58
(Continued)

FOREIGN PATENT DOCUMENTS

WO   2015/079762   6/2015

OTHER PUBLICATIONS

X. Song, A. Q. Huang, "6.5kV FREEDM-Pair: Ideal High Power Switch Capitalizing on Si and SiC", EPE 2015 ECCE Europe.
(Continued)

*Primary Examiner* — William Hernandez
(74) *Attorney, Agent, or Firm* — Dicke, Billig & Czaja, PLLC

(57) ABSTRACT

An electric assembly includes a reverse conducting switching device and a rectifying device. The reverse conducting switching device includes transistor cells for desaturation configured to be, under reverse bias, turned on in a desaturation mode and to be turned off in a saturation mode. The rectifying device is electrically connected anti-parallel to the switching device. In a range of a diode forward current from half of a maximum rating diode current of the switching device to the maximum rating diode current, a diode I/V characteristic of the rectifying device shows a voltage drop across the rectifying device higher than a saturation I/V characteristic of the switching device with the transistor cells for desaturation turned off and lower than a desaturation I/V characteristic of the switching device with the transistor cells for desaturation turned on.

20 Claims, 17 Drawing Sheets

(51) Int. Cl.
| | |
|---|---|
| H01L 29/417 | (2006.01) |
| H01L 29/47 | (2006.01) |
| H01L 29/739 | (2006.01) |
| H01L 29/861 | (2006.01) |
| H01L 29/872 | (2006.01) |
| H01L 29/40 | (2006.01) |
| H01L 25/07 | (2006.01) |
| H01L 29/06 | (2006.01) |
| H03K 17/16 | (2006.01) |
| H01L 27/07 | (2006.01) |
| H02M 3/156 | (2006.01) |
| H02M 5/293 | (2006.01) |
| H02M 7/217 | (2006.01) |
| H02M 7/537 | (2006.01) |
| H01L 29/20 | (2006.01) |
| H02M 3/158 | (2006.01) |
| H02M 7/219 | (2006.01) |
| H02M 7/5387 | (2007.01) |
| H02M 1/00 | (2006.01) |

(52) U.S. Cl.
CPC ...... *H01L 29/0623* (2013.01); *H01L 29/1608* (2013.01); *H01L 29/407* (2013.01); *H01L 29/417* (2013.01); *H01L 29/47* (2013.01); *H01L 29/7392* (2013.01); *H01L 29/8611* (2013.01); *H01L 29/8613* (2013.01); *H01L 29/872* (2013.01); *H03K 17/162* (2013.01); *H01L 27/0711* (2013.01); *H01L 29/20* (2013.01); *H01L 29/2003* (2013.01); *H01L 29/7393* (2013.01); *H02M 3/156* (2013.01); *H02M 3/158* (2013.01); *H02M 5/293* (2013.01); *H02M 7/217* (2013.01); *H02M 7/219* (2013.01); *H02M 7/537* (2013.01); *H02M 7/5387* (2013.01); *H02M 2001/0051* (2013.01); *H03K 2217/0009* (2013.01); *Y02B 70/1491* (2013.01)

(58) Field of Classification Search
USPC ........ 327/419, 427, 432, 434, 478, 574, 581
See application file for complete search history.

(56) References Cited

U.S. PATENT DOCUMENTS

| | | |
|---|---|---|
| 6,049,108 A | 4/2000 | Williams et al. |
| 7,889,174 B2 | 2/2011 | Culver |
| 9,543,389 B2 | 1/2017 | Laven et al. |
| 2014/0125293 A1 | 5/2014 | Kainuma et al. |
| 2015/0109031 A1 | 4/2015 | Rahimo |
| 2015/0214856 A1 | 7/2015 | Nakashima et al. |

OTHER PUBLICATIONS

M. Rahimo, et al.: "Characterization of a Silicon IGBT and Silicon Carbide MOSFET Cross-Switch Hybrid"; IEEE Transactions on Power Electronics, vol. 30, No. 9, Sep. 2015.

M. Rahimo, et al.: "The Cross Switch "XS" Silicon and Silicon Carbide Hybride Concept"; PCIM Europe 2015, 19.-21. May 19-21, 2015; Nuernberg, Deutschland.

S. Fichtner, et al.: "Electro-Thermal Simulations and Experimental Results on teh Surge Current Capability of 1200 V SiC MPS Diodes"; 8th International Conference on Integrated Power Electronics Systems (CIPS 2014), Feb. 25-27, 2014, Nuremberg—Berlin, Offenbach:VDE Verlag, 2014, S. 438-443.

* cited by examiner

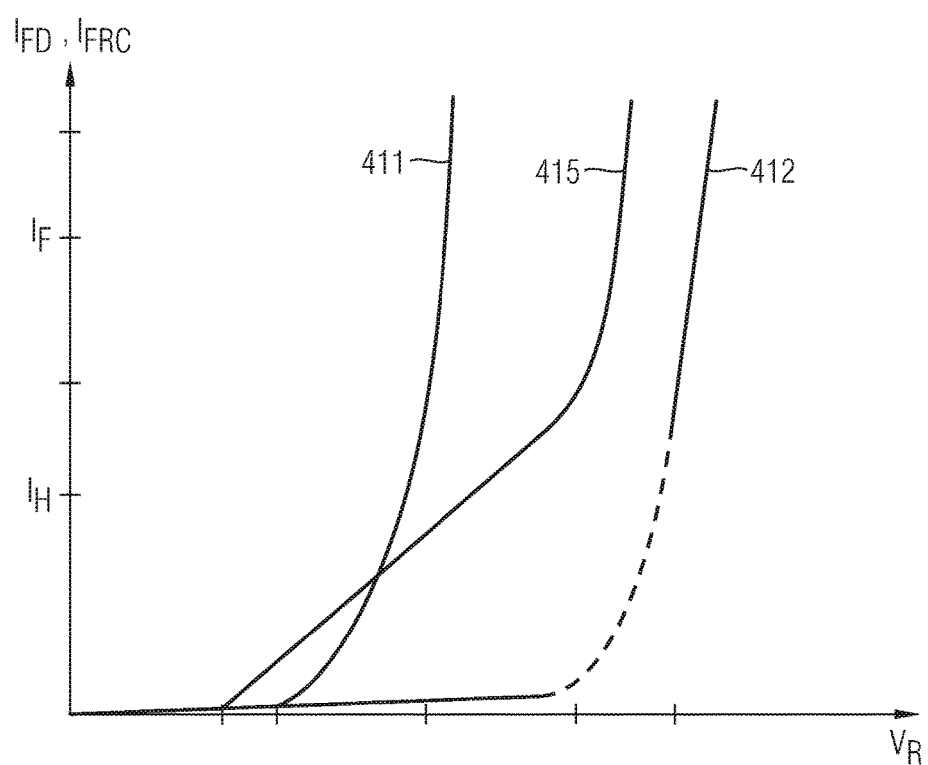

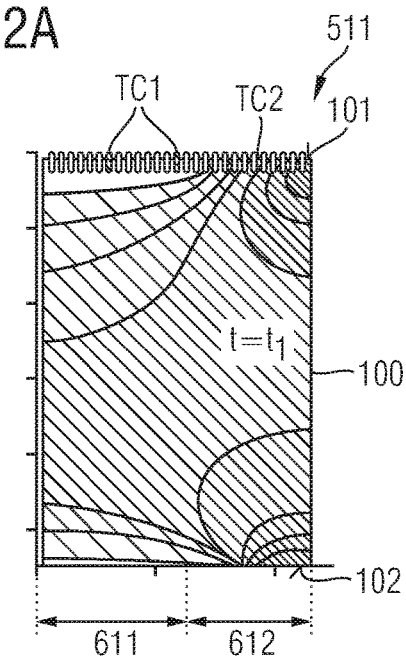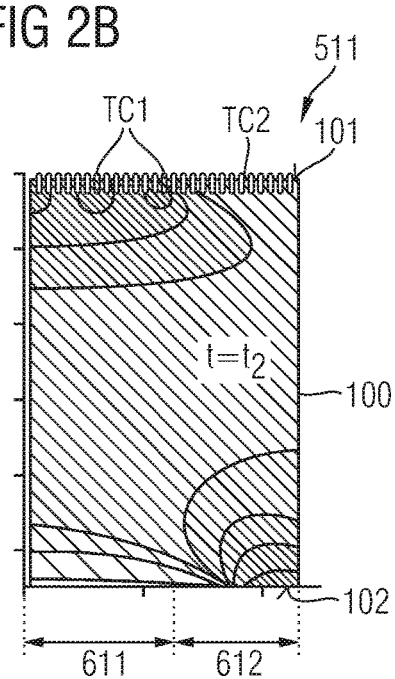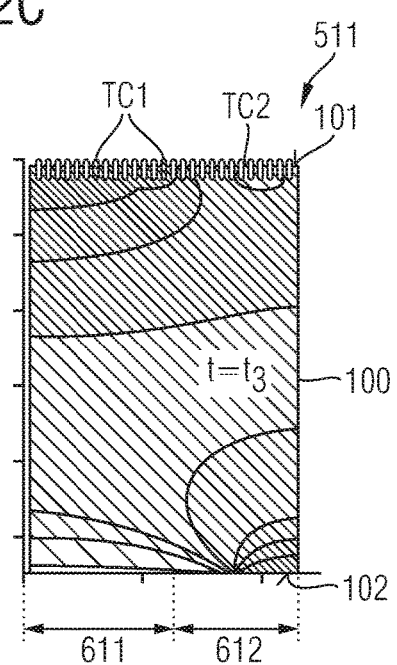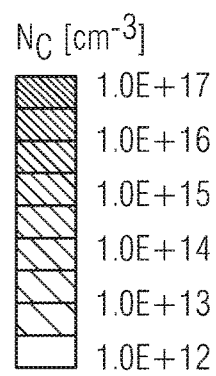

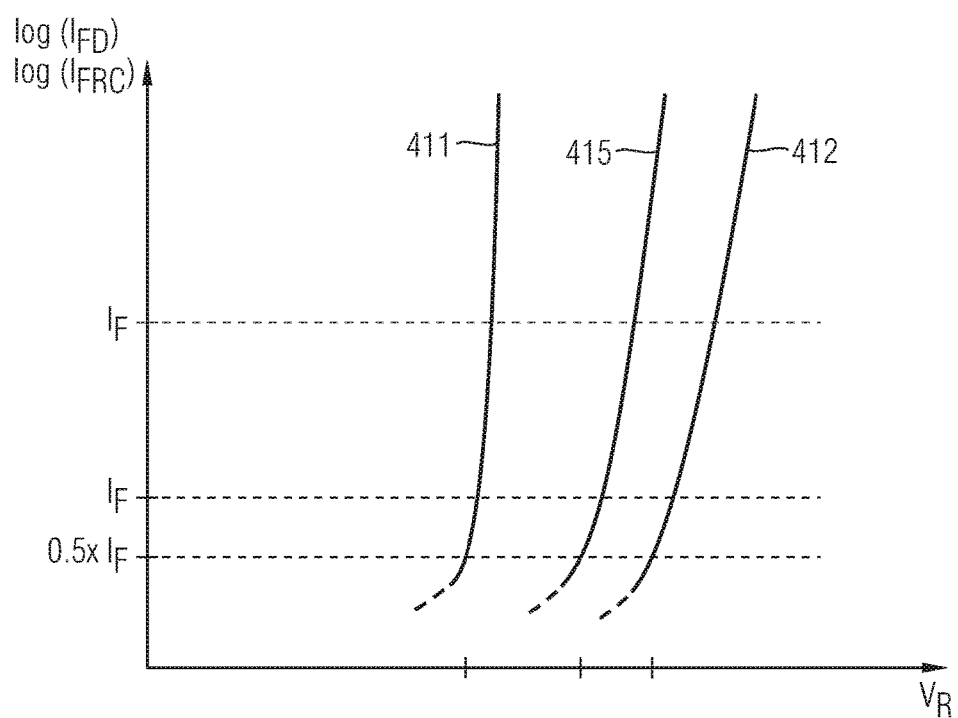

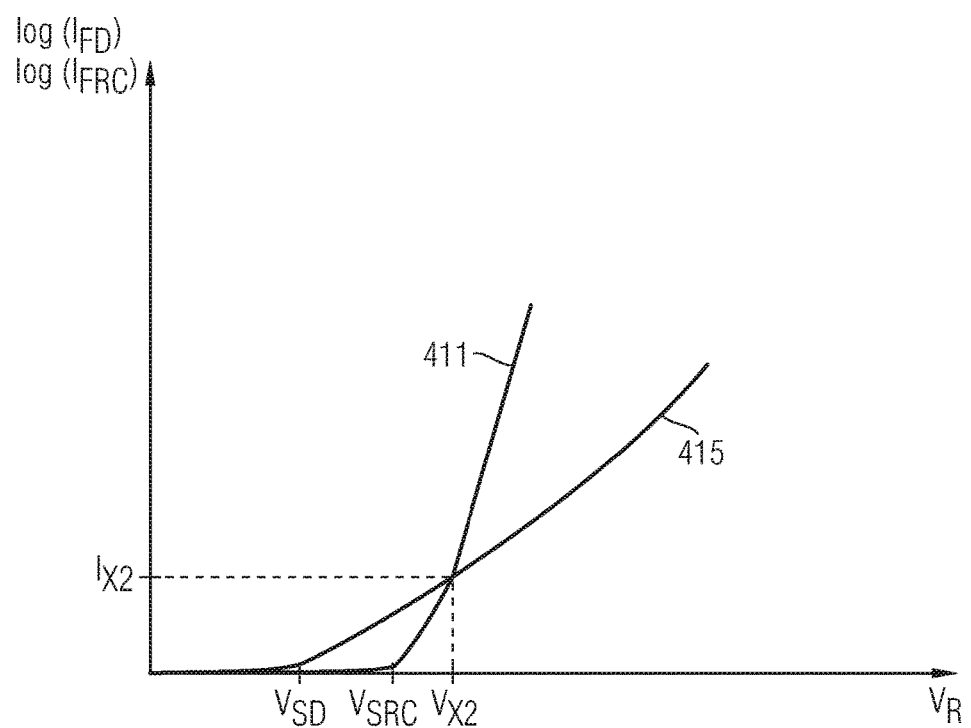

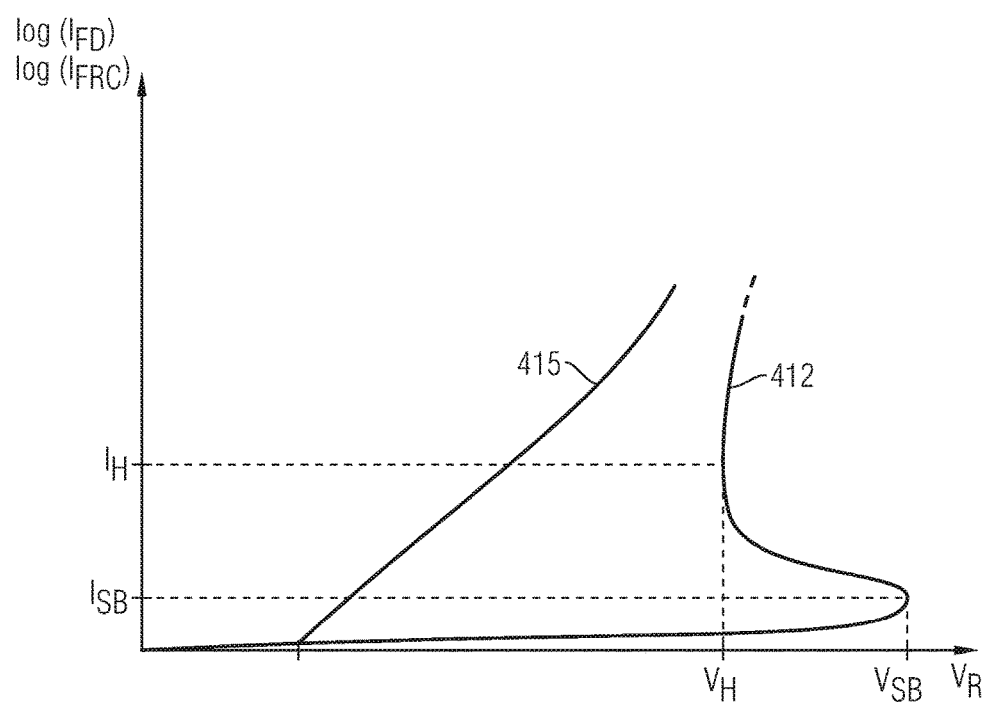

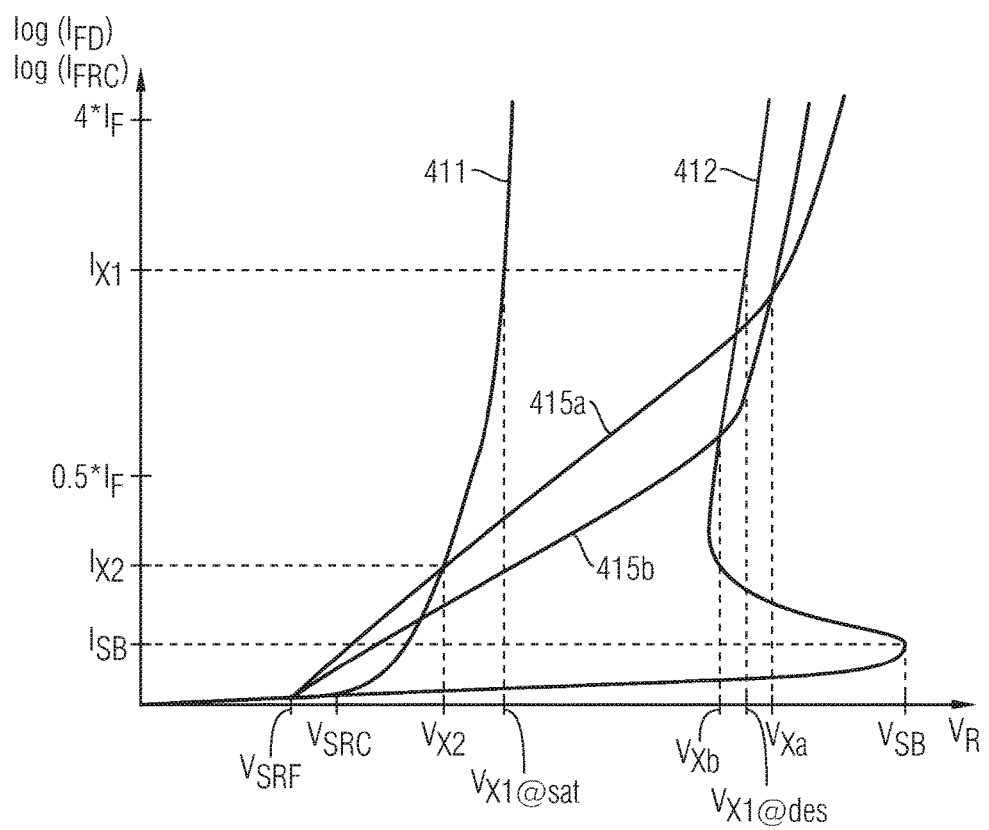

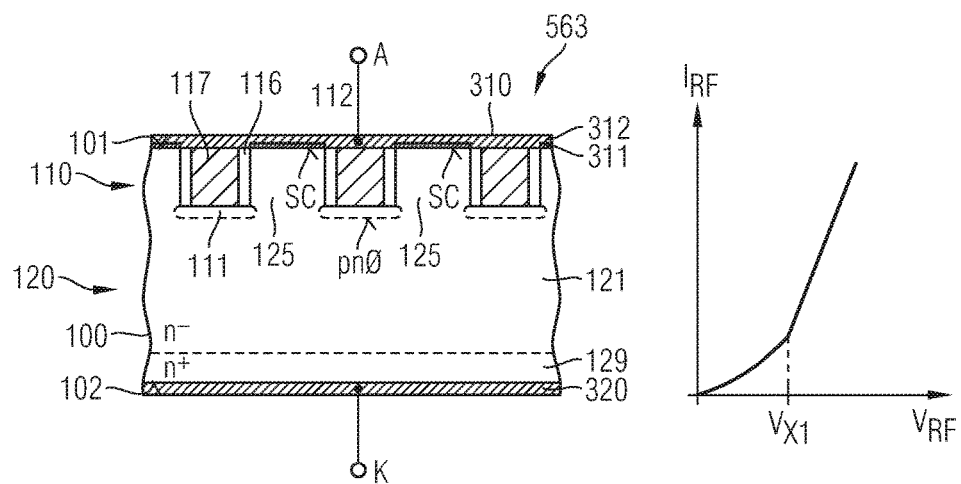
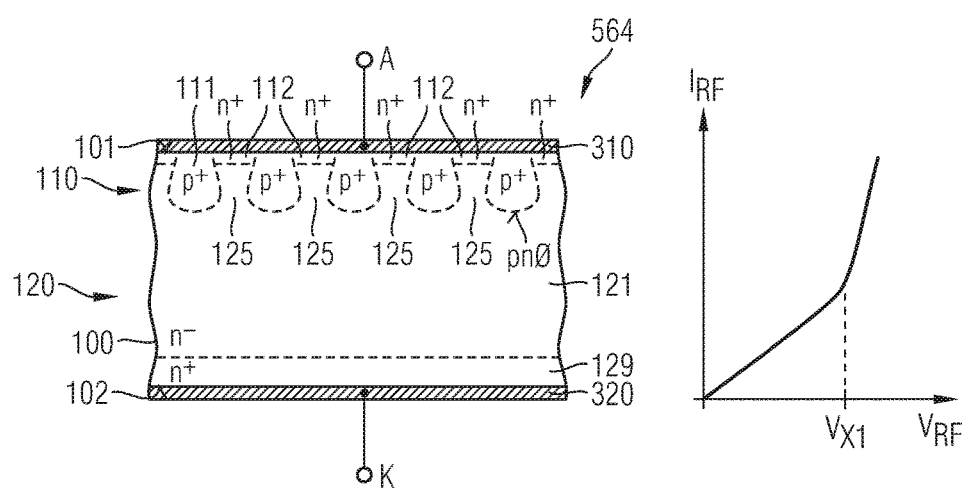

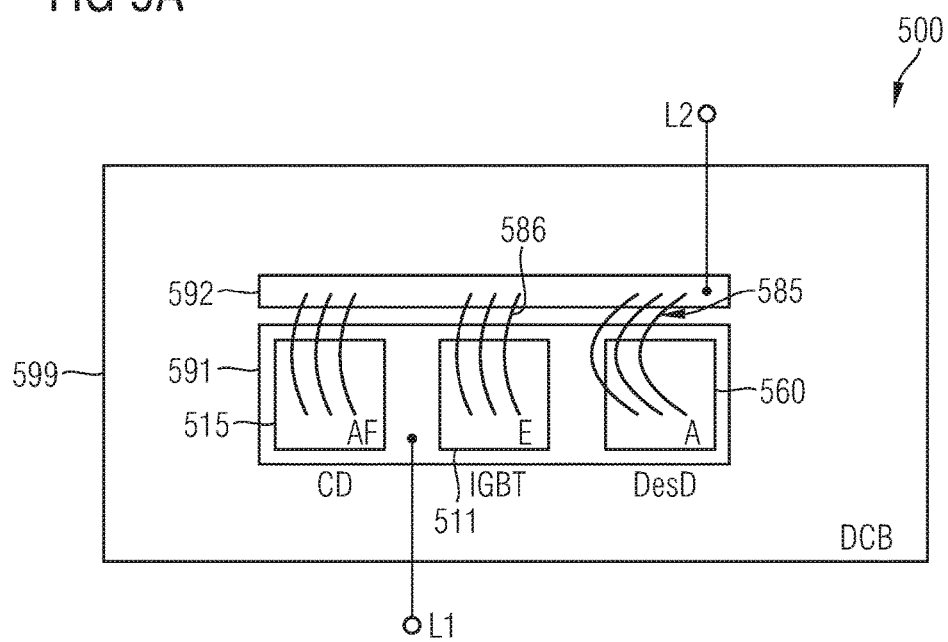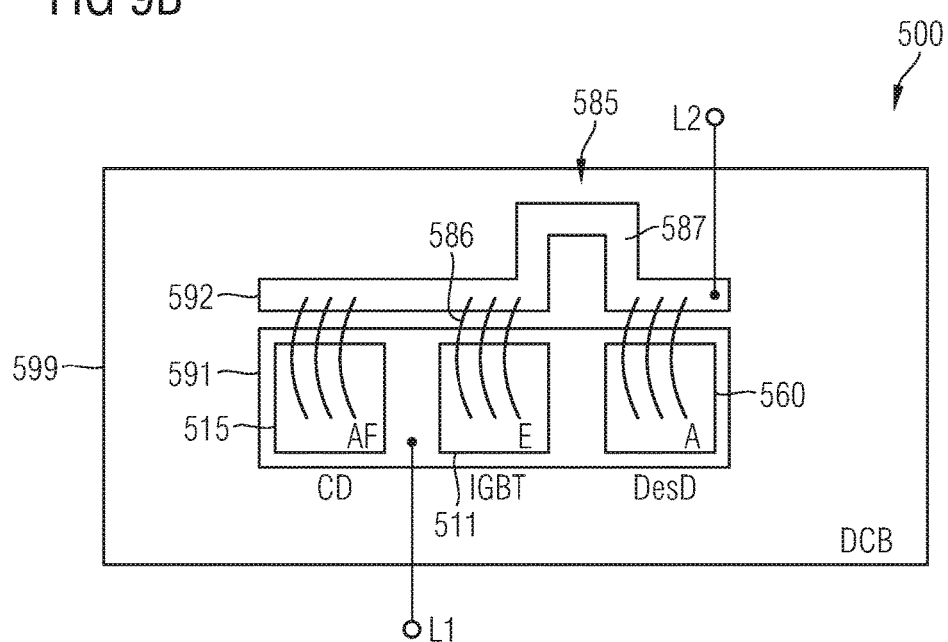

ELECTRIC ASSEMBLY INCLUDING A REVERSE CONDUCTING SWITCHING DEVICE AND A RECTIFYING DEVICE

CROSS-REFERENCE TO RELATED APPLICATION

This Utility Patent Application claims priority to German Patent Application No. 10 2016 109 235.5, filed May 19, 2016 which is incorporated herein by reference.

BACKGROUND

Reverse conducting switching devices, such as IGFETs (insulated gate field effect transistors) and RC-IGBTs (reverse conducting insulated gate bipolar transistors) include an integrated body diode, which is forward biased under reverse bias of the switching device. A pn junction of the forward biased body diode injects charge carriers of both conductivity types that flood the semiconductor portion of the switching device and build up a dense charge carrier plasma that results in low electric resistance of the reverse biased switching device.

When the bias changes from reverse to forward, the body diode blocks and a reverse recovery current relieves the charge carrier plasma. The reverse recovery current contributes to dynamic switching losses of the switching device. In a desaturation period preceding a commutation following a change from reverse bias to forward bias, some transistor cells turn on such that injection of charge carriers along the pn junction of the body diode is reduced and the charge carrier plasma attenuates before commutation. A safety period between the end of the desaturation period and the start of commutation allows the switching device to timely restore its blocking capability with closed gated channels before commutation. During the safety period the charge carrier plasma may partially recover such that the safety period foils to some degree the effect of the desaturation period.

It is desirable to improve the switching characteristics of reverse conducting switching devices in electronic circuits.

SUMMARY

According to an embodiment an electric assembly includes a reverse conducting switching device that includes transistor cells for desaturation. The transistor cells for desaturation are configured to be, under reverse bias, turned on in a desaturation mode and to be turned off in a saturation mode. A rectifying device is electrically connected anti-parallel to the switching device. In a range from half of a maximum rating diode current of the switching device to at least the maximum rating diode current of the switching device, a diode I/V characteristic of the rectifying device shows a voltage drop across the rectifying device higher than a saturation I/V characteristic of the switching device with the transistor cells for desaturation turned off and lower than a desaturation I/V characteristic of the switching device with the transistor cells for desaturation turned on.

According to another embodiment an electric assembly includes a reverse conducting switching device and a rectifying device electrically connected anti-parallel to the switching device. The switching device includes transistor cells for desaturation. The transistor cells for desaturation are configured to be, under reverse bias, turned on in a desaturation mode and to be turned off in a saturation mode. Below a threshold voltage of a reverse voltage across the electric assembly, a diode forward current of the rectifying device is higher than a reverse current through the switching device. For a reverse voltage above the threshold voltage, the diode forward current through the rectifying device is lower than the reverse current through the switching device with the transistor cells for desaturation turned off.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic diagram illustrating the I/V characteristics of the reverse conducting switching device and of the rectifying device of the electric assemblies of FIGS. 1A and 1B according to an embodiment.

FIG. 2A is a schematic diagram showing the charge carrier distribution in a desaturation portion and in an injection portion of an RC-IGBT at the end of a desaturation period for discussing effects of the embodiments.

FIG. 2B is a schematic diagram showing the charge carrier distribution in the desaturation and injection portions of the RC-IGBT of FIG. 2A after a safety period for discussing effects of the embodiments.

FIG. 2C is a schematic diagram showing the charge carrier distribution in the desaturation and injection portions of the RC-IGBT of FIG. 2A at commutation for discussing effects of the embodiments.

FIG. 3A is a schematic diagram showing the I/V characteristics of a switching device and a rectifying device of an electric assembly according to an embodiment, with the diode I/V characteristic of the forward biased rectifying device between a saturation I/V characteristic and the desaturation I/V characteristics of the switching device under reverse bias.

FIG. 3B is a schematic diagram showing I/V characteristics of a rectifying device and a switching device of an electric assembly according to an embodiment with the diode I/V characteristic of the forward biased rectifying device intersecting the saturation I/V characteristic of the reverse biased switching device.

FIG. 3C is a schematic diagram showing I/V characteristics of a switching device and a rectifying device of an electric assembly according to an embodiment with the desaturation I/V characteristic of the switching device under reverse bias showing a significant snap back.

FIG. 4B is a schematic diagram showing the I/V characteristics of a switching device and a rectifying device of an electric assembly according to an embodiment with the diode I/V characteristic of the rectifying device intersecting the desaturation I/V characteristic of the switching device.

FIG. 7C includes a schematic vertical cross-sectional view of a portion of a desaturation diode on the basis of a TOPS (trench oxide pin Schottky) diode according to an embodiment and a schematic diagram illustrating the I/V characteristic of the desaturation diode under forward bias.

FIG. 7D includes a schematic vertical cross-sectional view of a portion of a desaturation diode on the basis of an IDEE (inverse-injection-dependency-of-emitter-efficiency) diode according to an embodiment and a schematic diagram illustrating the I/V characteristic of the desaturation diode under forward bias.

FIG. 9A is a schematic plan view of a direct copper bonded board with an electric assembly according to an embodiment including a silicon RC-IGBT, an SiC desaturation diode, and an SiC clamping diode.

FIG. 9B is a schematic plan view of a direct copper bonded board with an electric assembly according to another embodiment with a strip conductor forming a loop between a silicon RC-IGBT and an SiC desaturation diode.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
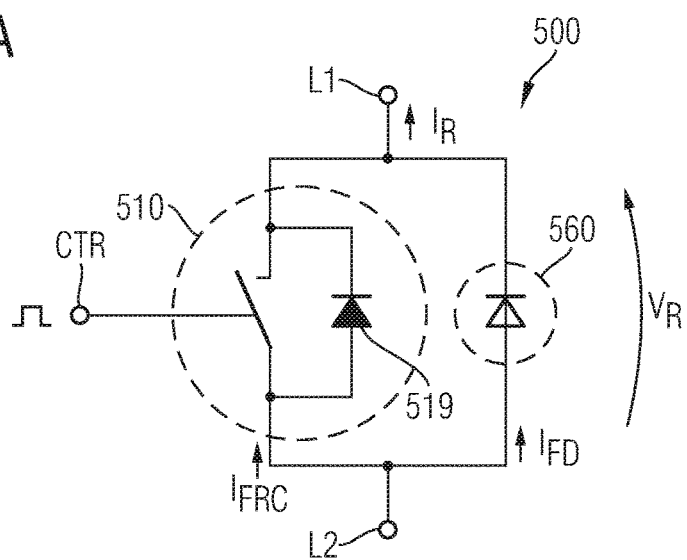
FIG. 1A is a schematic circuit diagram of an electric assembly including a reverse conducting switching device and a rectifying device according to an embodiment.
Figure 1B:
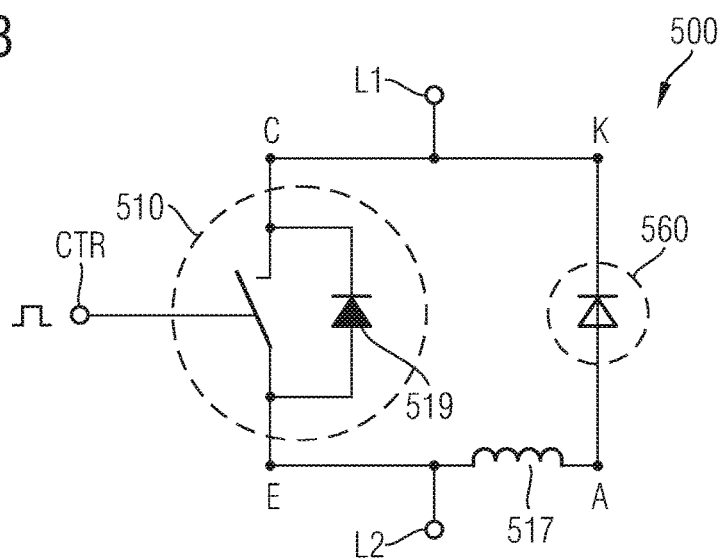
FIG. 1B is a schematic circuit diagram of an electric assembly including a reverse conducting switching device and a rectifying device according to a further embodiment.

FIGS. 1A to 1B refer to an electric assembly 500 that may form or may be part of a high-side switch or a low-side switch of a half-bridge circuit, wherein the half-bridge circuit may be part of a H-bridge, a motor controller or a switched-mode power converter, e.g., a DC/DC power converter, a DC/AC power converter, an AC/AC power converter, or an AC/DC converter. According to other embodiments, the electric assembly 500 may be a multilevel inverter, e.g., a multilevel NPC (neutral point clamped) inverter, or a PFC (power factor correction) converter.

FIG. 1A shows the electric assembly 500 including a reverse conducting switching device 510 that includes an integrated body diode 519. A load path of the switching device 510 is electrically connected between a first and a second load terminal L1, L2 of the electric assembly 500.

One of the first and second load terminals L1, L2, for example, the first load terminal L1 is at the supply side and may be electrically coupled to a power supply. The other one of the first and second load terminals L1, L2, for example, the second load terminal L2 is at the load side and may be electrically coupled to a load to which the power supply supplies a load current through the electric assembly 500.

The switching device 510 includes transistor cells and may be an IGFET, for example an MOSFET (metal-oxide semiconductor field effect transistor) in the usual meaning including IGFETs with metal gates and/or with gates containing a semiconductor material such as heavily doped polycrystalline silicon. According to an embodiment the switching device 510 is an RC-IGBT. A control signal supplied through a control terminal CTR of the electric assembly 500 turns on and off the switching device 510.

A rectifying device 560 is electrically connected to the first and second load terminals L1, L2. The rectifying device 560 is connected anti-parallel with respect to the switching device 510 and in parallel with the body diode 519 of the switching device 510. The rectifying device 560 may be a freewheeling diode, by way of example.

Under forward bias, a positive voltage drops between the first and second load terminals L1, L2 of the electric assembly 500 such that the rectifying device 560 is reverse biased and blocks, whereas the switching device 510 is forward biased and switches a load current between the first load terminal L1 and the second load terminal L2 of the electric assembly 500 in response to the control signal applied to the control terminal CTR. Since apart from a negligible leakage current no further current flows through the rectifying device 560, only the switching device 510 contributes to static electric losses in the forward biased electric assembly 500.

The rectifying device 560 and the switching device 510 are separated semiconductor devices in different housings and electrically connected through strip conductors and/or wiring bonds. Physical connections between a cathode terminal K of the rectifying device 560 and a collector terminal C of the switching device 510 and/or between an anode terminal A of the rectifying device 560 and an emitter terminal E of the switching device 510 may have an intrinsic, non-negligible effective inductance greater 0.1 nH.

FIG. 1B shows a discrete inductive element 517 electrically connected between terminals of the switching device 510 and rectifying device 560 assigned to the second load terminal L2. The effective inductance may be at least 0.1 nH, for example, at least 1 nH or at least 10 nH.

When, starting from an off-state level, the control signal applied to the control terminal CTR rises above or falls below a turn-on threshold voltage, the switching device 510 turns on, wherein by field effect the transistor cells TC form gated channels that provide a low-resistive path between the first and the second load terminals L1, L2 for a load current that flows through the switching device 510 and the load. The switching device 510 turns off when the control signal returns to the off-state level.

Under reverse bias of the electric assembly 500, the switching device 510 is reverse biased. The body diode 519 of the switching device 510 is forward biased and conducts a reverse current $I_{FRC}$ of the switching device 510. A datasheet of a reverse conductive switching device typically defines a nominal diode forward current $I_F$ as the maximum rating diode current for the reverse current $I_{FRC}$ up to which operation of the switching device 510 is safe. When all transistor cells of the switching device 510 are turned off, the reverse current $I_{FRC}$ is a bipolar current and corresponds to the diode forward current of the body diode 519. The bipolar current generates a dense charge carrier plasma in a semiconductor portion of the switching device 510. The denser the charge carrier plasma is, the lower is an ohmic reverse resistance $R_{rev}$ of the switching device 510 under reverse bias.

FIG. 1B shows a saturation I/V characteristic 411 of the reverse biased switching device 510, wherein the saturation I/V characteristic 411 results from the bipolar current in case all transistor cells including the transistor cells for desaturation are turned off. The saturation I/V characteristic 411 is the I/V characteristic of the saturated body diode 519.

When in the reverse-biased state of the switching device 510 a control signal applied to the control terminal CTR or to an auxiliary terminal used for exclusively controlling the transistor cells for desaturation turns on the transistor cells for desaturation, the gated channels of the transistor cells for desaturation start to carry at least a portion of the reverse current $I_R$ through the electric assembly 500. The transistor cells for desaturation may be some or all of the transistor cells that control the load current through the switching device 510 under forward bias or may be additional transistor cells that are not switched under forward bias.

The gated channels of the transistor cells for desaturation may reduce the voltage drop across all or some of the pn junctions of the body diode 519 to below the built-in potential such that the concerned pn junctions stop injecting charge carriers. Instead of a fully bipolar current, at least in portions of the semiconductor portions a unipolar current substitutes the bipolar current in the on-state of the transistor cells for desaturation. Since the injection of charge carriers along at least some of the pn junctions of the body diode 519 is suppressed, charge carrier plasma density drops and the electric resistance increases.

The remaining current defines a desaturation I/V characteristic 412 of the reverse-biased switching device 510 as illustrated in FIG. 1B. Since the charge carrier plasma is less dense with respect to the saturated state, the desaturation I/V characteristic 412 is shifted to higher values of the reverse voltage $V_R$ for the same reverse current $I_{FRC}$ through the switching device 510. The ohmic reverse resistance $R_{rev}$ is significantly greater than for the exclusively bipolar current and results in a higher voltage drop across the switching device 510 for the same reverse current $I_{FRC}$ through the switching device 510 and in a smaller reverse current $I_{FRC}$ at the same reverse voltage $V_R$.

Further under reverse bias of the electric assembly 500 the rectifying device 560 is forward biased and a portion of the total reverse current $I_R$ flows as diode forward current $I_{FD}$ through the rectifying device 560. A diode I/V characteristic 415 of the rectifying device 560 is schematically illustrated in FIG. 1B. The diode I/V characteristic 415 is a function of type, layout, dimensions as well as dopant gradients and dopant concentrations in the rectifying device 560 and can be tailored to the application.

According to an embodiment, type, layout, dimensions, dopant gradients and dopant concentrations of the rectifying device 560 are defined such that for diode forward currents $I_{FD}$ of the rectifying device 560 up to at least the nominal diode forward current of the switching device 510, e.g., up to at least twice or up to four times, the diode I/V characteristic 415 is on the left-hand side of the desaturation I/V characteristic of the switching device 510. In other words, at least within the nominal operating range the rectifying device 560 carries the greater portion of the total reverse current $I_R$ through the electric assembly 500 during desaturation and the diode forward current $I_{FD}$ through the rectifying device 560 is greater than the reverse current $I_{FRC}$ through the reverse-biased switching device 510.

Typically, in the reverse biased mode all of the transistor cells of the switching device 510 are off such that the exclusively bipolar reverse current $I_{FRC}$ ensures high charge carrier plasma density and low ohmic resistance of the switching device 510. Since the high density charge carrier plasma increases the switching losses, conventional desaturable reverse conducting switching devices 510, e.g., RCDC (reverse-conducting with diode control)-IGBTs, are desaturated before commutation by switching on the transistor cells for desaturation in a desaturation period preceding the commutation that follows the transition from reverse bias to forward bias.

The concerned transistor cells for desaturation typically turn off again timely before commutation such that the switching device 510 safely blocks at the time commutation starts and critical circuit conditions can be avoided, for example, a short-circuit condition with both the high side and the low side switch of a half-bridge circuit being turned on. During desaturation a unipolar current flows through the transistor cells for desaturation and a bipolar current may flow in regions without turned-on transistor cells to keep a reverse current flowing. As a consequence, charge carriers are also present in the semiconductor portion during desaturation. In a safety period between the end of desaturation and start of commutation a bipolar current again supersedes the unipolar current flow through the transistor cells for desaturation, which are turned on again, wherein the charge carriers already present in the semiconductor portion have impact on the starting level of the rise of the charge carrier density.

With the diode I/V characteristic 415 of FIG. 1B, during the desaturation period most of the reverse current $I_R$ through the electric assembly 500 flows as diode forward current $I_{FD}$ through the rectifying device 560 and only few charge carriers flow through the switching device 510 such that the starting level of the rise of the charge carrier plasma density in the semiconductor portion is low.

Since the switching device 510 is nearly completely turned off, a higher voltage is needed to turn the switching device 510 on. This in combination with an inductance effective between the switching device 510 and the rectifying device 560 obstructs a fast takeover of the reverse current $I_R$ from the rectifying device 560 to the switching device 510. Charge carrier density in the switching device 510 remains low in the safety period that follows desaturation such that the electric assembly 500 can combine high desaturation efficiency with high reliability against critical circuit conditions in the application.

Alternatively or in addition, material, dimensions, layout, dopant concentrations and dopant gradients of the rectifying device 560 are tuned such that within the nominal operating range the diode I/V characteristic 415 intersects the saturation I/V characteristic 411 of the reverse biased switching device 510.

At low-current conditions with only a low reverse current $I_R$ through the electric assembly 500, the rectifying device 560 takes most of the total reverse current $I_R$ at a lower reverse voltage $V_R$ than for a typical pn junction such that, for example, power consumption for open-circuit conditions and power conversion efficiency under low-load conditions can significantly be improved.

Alternatively or in addition, the switching device 510 is designed with a significant snap-back in a range of a reverse current $I_{FRC}$ lower than a snap-back current $I_{SB}$, wherein up to the snap-back current $I_{SB}$ the diode I/V characteristic 415 is on the left hand side of the desaturation I/V characteristic 412 of the reverse biased switching device 510 such that up to the snap-back current $I_{SB}$ the rectifying device 560 carries a greater portion of the total reverse current $I_R$ through the electric assembly 500.

Since the rectifying device 560 takes most of the current in case the transistor cells TC used for desaturation are on, a snap-back behavior of the switching device 510 is attenuated or does not come into effect. The switching device 510 can be designed to allow for a significant snap-back, because the rectifying device 560 significantly attenuates or sup-presses the effect of the snap-back on the application. For example, in case the switching device 510 is an RC-IGBT, p- and n-doped regions at the collector side may be optimized for a low ohmic reverse resistance $R_{rev}$ and a low on-state resistance $R_{on}$ and/or specific transistor cells designed for attenuating the snap-back effect can be omitted.

Alternatively or in addition, the diode I/V characteristic 415 may be designed such that the voltage drop across the forward biased diode is always smaller than a maximum snap-back voltage $V_{SB}$ or snap-back hold voltage $V_H$ of the switching device 510 for a diode forward current $I_{FD}$ through the forward biased rectifying device 560 up to at least the nominal diode forward current $I_F$, e.g., up to twice or up to four times the nominal diode forward current $I_F$ to avoid any snap-back of the reverse-biased switching device 510.

FIGS. 2A to 2E illustrate the effect of a desaturation period on the charge in a semiconductor portion 100 of an RC-IGBT 511.

A desaturation portion 611 of the semiconductor portion 100 includes first gated channels TC1, e.g., transistor cells for desaturation that turn on during a desaturation period. The first gated channels TC1 may be dedicated desaturation cells that only turn on during desaturation or may include some of the transistor cells used for controlling a load current under forward bias. An injection portion 612 may exclusively include second gated channels TC2, e.g., transistor cells that do not turn on during desaturation and that keep the reverse current flowing through the switching device 510. The second gated channels TC2 may be transistor cells used for controlling a load current under forward bias.

FIG. 2A shows the charge carrier distribution in the desaturation portion 611 and in the injection portion 612 of the RC-IGBT 511 at the end of a desaturation period at t=t1. Charge carrier density is low in sections of the desaturation portion 611 close to the opposite first and second surfaces 101, 102 of the semiconductor portion 100, because in the on-state of the first gated channels TC1 no bipolar current flows in the desaturation portion 611, whereas charge carrier density remains high in the injection portion 612.

At a nominal end t=t2 of a safety period, which is shorter than the desaturation period, charge carrier density has significantly recovered in the desaturation portion 611 as shown in FIG. 2B. After desaturation the high effective anode regions of the first gated channels TC1 used for desaturation are promptly reactivated and promptly start to reestablish the high density charge carrier plasma. The safety period foils the effect of desaturation to a non-negligible degree.

FIG. 2C shows the charge carrier distribution after actual start of commutation. The high reverse recovery charge results in a comparatively high commutation current, which is the source of high switching losses.

Figure 2D:
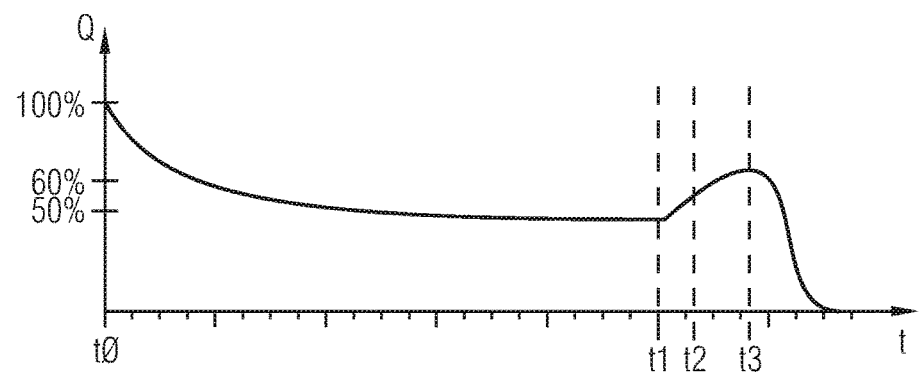
FIG. 2D is a schematic diagram showing a change of a total charge in the RC-IGBT of FIGS. 2A to 2C during and after desaturation for discussing effects of the embodiments.

FIG. 2D shows the total charge in the semiconductor portion 100 during and after desaturation. At t=t0 desaturation starts and charge carrier density in the semiconductor portion 100 drops. At the end of the desaturation period at t=t1, which is the start of the safety period, the total charge of the desaturated RC-IGBT 511 is about 50% of the charge of the saturated RC-IGBT 511 at the beginning of the desaturation period. Up to the nominal end of a safety period at t=t2, the total charge again increases to about 60% of the saturated RC-IGBT 511. At t=t3 the total charge may be even higher than at the nominal end of the desaturation period.

Figure 2E:
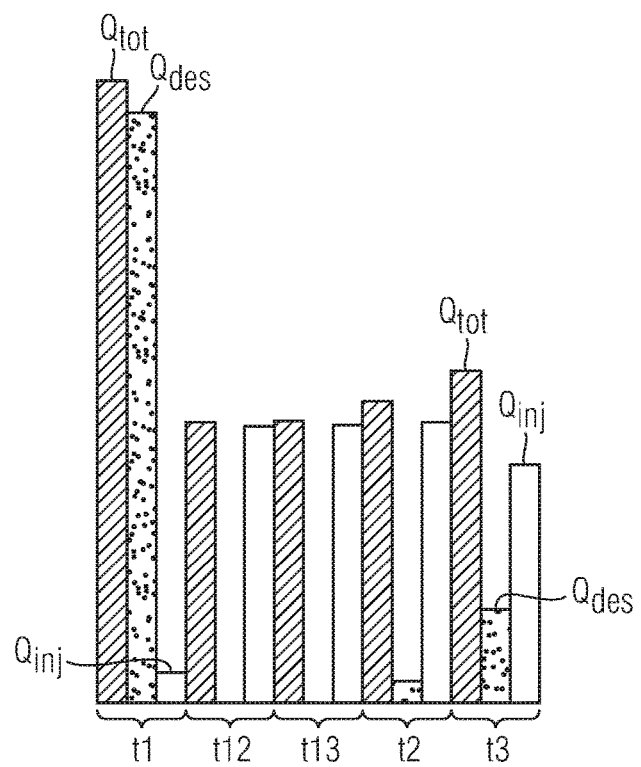
FIG. 2E is a schematic diagram illustrating contributions to the total charge in the RC-IGBT of FIGS. 2A to 2D.

FIG. 2E shows the charge $Q_{des}$ in the desaturation portion 611 of the RC-IGBT 511, $Q_{inj}$ shows the charge in the injection portion 612 and $Q_{tot}$ shows the total charge in the semiconductor portion 100 at different points in time.

At t=t12 shortly after the end of the desaturation period, the previously turned-on first gated channels TC1 in the desaturation portion 611 suppressed injection in the desaturation portion 611 and a charge carrier plasma with a low amount of charges $Q_{des}$ has been established in the desaturation portion 611. The contribution of the charge $Q_{inj}$ in the injection portion 612 is comparatively high. Also later in the safety period at t=t13, the reverse current remains mainly flowing in the injection portion 612. Consequently, the plasma density increases only slowly in the desaturation portion 611 until the current changes its direction during commutation at t=t3.

In the electric assembly 500 of FIG. 1A, which includes a switching device 510 and a rectifying device 560 with I/V characteristics as defined in FIG. 1B, the rectifying device 560 may carry a great portion of the remaining reverse current $I_R$ during desaturation.

In case the switching device 510 includes an injection portion 612, the injection portion 612 carries only a small portion of the first current $I_R$. Re-establishment of the charge carrier plasma after the end of the saturation starts from a lower level and may be hampered by stray inductance and/or additional discrete inductive elements in the connection lines to the switching device 510. Further, the switching device 510 may be designed with only a small or with no injection portion 612 such that desaturation is effective in the complete semiconductor portion 100. For example, all transistor cells used for controlling a load current under forward bias may be addressed during desaturation.

FIG. 3A refers to an embodiment of the electric assembly 500 according to FIG. 1A. A diode I/V characteristic 415 of the rectifying device 560 is between the saturation I/V characteristic 411 and the desaturation I/V characteristic 412 of the switching device 510 at least for a range of a reverse current $I_{FRC}$ of the switching device 510 from $I_F/2$ up to at least $I_F$, e.g., up to $2^*I_F$ or up to $4^*I_F$, wherein $I_F$ is the maximum rating for the diode forward current of the integrated body diode 519 at a predefined case temperature.

According to another embodiment, the forward current $I_{FD}$ of the rectifying device 560 is greater than for the reverse-biased switching device 510 during desaturation for the complete nominal operating range of the switching device 510 such that only few charge carriers are injected into the semiconductor portion of the RC-IGBT 511 during desaturation and desaturation efficiency is high. At the same time, the forward current $I_{FD}$ of the rectifying device 560 is lower than for the saturated reverse-biased switching device 510 for a range of $I_{FRC}$ from at least $0.1^*I_F$ to $I_F$, e.g., from $0.3^*I_F$ up to at least $2^*I_F$ or up to $4^*I_F$ to exploit the high density charge carrier plasma of the saturated RC-IGBT 511 for the static RC mode.

According to an embodiment, the rectifying device 560 is from a wide-bandgap material. For example, the rectifying device 560 is an SiC (silicon carbide) diode that includes a unipolar portion with a unipolar Schottky contact, an ohmic contact, or a gated channel, and that includes a bipolar portion, wherein a first section of the diode I/V characteristic 415 in the nominal operating range is defined mainly by the unipolar portion and a second section of the diode I/V characteristic 415 is mainly defined by the bipolar portion.

At a thickness of a semiconductor portion of the RC-IGBT of 600 μm or less, the rectifying device 560 may be based on silicon carbide with an active area of less than 600 μm, wherein a thickness of a low-doped drift zone of the rectifying device 560 may be in a range from 4 μm to 60 μm.

By designing the rectifying device 560 to exhibit a diode I/V characteristic 415 between the saturation and desaturation I/V characteristics 411, 412 of the reverse-biased switching device 510, a reverse current $I_{FRC}$ in the switching device 510 during desaturation is only a small portion of the total reverse current $I_R$ and only few charge carriers are present in the switching device 510 at the end of the desaturation period.

Desaturation efficiency is significantly improved compared to electric assemblies with rectifying devices 560 having an I/V characteristic intersecting the desaturation I/V characteristic 412 of the switching device 510 within the nominal operating range, because reestablishment of the charge carrier plasma starts from a significantly lower level. The more efficient desaturation may either result in that a safety period between end of desaturation and start of commutation is increased and/or in that switching losses are reduced.

In FIG. 3B the diode I/V characteristic 415 of the rectifying device 560 of the electric assembly 500 of FIG. 1A intersects the saturation I/V characteristic 411 of the reverse-biased switching device 510 at a threshold voltage $V_{X2}$.

Below the threshold voltage $V_{X2}$, the forward current $I_{FD}$ through the rectifying device 560 is greater than the reverse current $I_{FRC}$ through the saturated reverse-biased switching device 510. For reverse voltages $V_R$ greater than the threshold voltage $V_{X2}$, the forward current $I_{FD}$ through the rectifying device 560 is lower than the reverse current $I_{FRC}$ of the saturated reverse biased switching device 510. For example, a set-in voltage $V_{SD}$ of the rectifying device 560 is lower than a set-in voltage $V_{SRC}$ of the body diode 519, e.g., the rectifying device 560 may include a Schottky contact with a set-in voltage $V_{SD}$ lower than the set-in voltage $V_{SRC}$ of a silicon pn junction of the body diode 519 of the switching device 510. The electric assembly 500 allows a reverse current flow at low reverse voltage $V_R$. Compared to other electronic assemblies including rectifying elements with a set-in voltage $V_{SD}$ equal to or greater than the set-in voltage $V_{SRC}$ of the body diode 519, ohmic losses generated during low-current operation, e.g., at open-circuit conditions of a switched mode power supply or in a stand-by mode of an electric application are significantly reduced.

According to an embodiment the rectifying device 560 includes an ohmic contact, a gated channel, or a Schottky contact with a set-in voltage $V_{SD}$ of at most 0.6 V, e.g., a Schottky contact with a molybdenum/silicon carbide barrier.

For increasing reverse current, the voltage drop across the electric assembly 500 rises above the set-in voltage $V_{SRC}$ of the body diode 519 such that the body diode 519 of the switching device 510 takes an increasing portion of the total reverse current $I_R$. At an intersection of the saturation I/V characteristic 411 of the saturated reverse biased switching device 510 and the diode I/V characteristic 415 of the forward biased rectifying device 560 the reverse current $I_R$ is evenly split between the reverse current $I_{FRC}$ through the saturated reverse-biased switching device 510 and the forward current $I_{FD}$ through the rectifying device 560.

In FIG. 3C the desaturation I/V characteristic of the reverse-biased switching device 510 shows a significant snap-back with a maximum snap-back voltage $V_{SB}$ and a snap-back hold voltage $V_H$, which is the minimum voltage across the reverse biased switching device 510 when the reverse current $I_{FRC}$ further increases after the snap-back. The reverse current $I_{FRC}$ at the hold voltage $V_H$ defines a hold current $I_H$. The rectifying device 560 may be designed such that in a range of the diode forward current $I_{FD}$ from 0 to the hold current hi the diode forward current $I_{FD}$ through the rectifying device 560 is significantly greater, for example, at least two times or at least ten times greater than the reverse current $I_{FRC}$ of the desaturated reverse-biased switching device 510.

The hold current $I_H$ is defined at the hold voltage $V_H$, which is the minimum voltage drop across the reverse biased switching device 510 after snap-back. When the rectifying device 560 takes most of the current for a current range in which the desaturated reverse-biased switching device 510 shows the snap-back, the effect of the snap-back on the application is low. Where typically RC-IGBTs are designed to minimize a snap-back effect on the costs of other device parameters, such as, for example on-state resistance, thermal resistance of the body diode, avalanche ruggedness and/or low reverse recovery charge, design constraints aiming at suppressing a snap-back behavior can be neglected such that there is more room for an improved trade-off as regards the other constraints. For example, all transistor cells may be used for desaturation and the switching device 510 includes only one type of transistor cells which can be controlled in the same way.

In addition, the rectifying device 560 is designed such that at least for a reverse current $I_{FRC}$ up to the nominal diode forward current $I_F$ of the reverse biased switching device 510, e.g., up to twice or up to four times the nominal diode forward current $I_F$, the diode forward current $I_{FD}$ through the forward biased rectifying device 560 is higher than the hold current $I_H$. As a consequence, the RC-IGBT is safe from a snap-back during which the RC-IGBT changes to a bipolar mode. The bipolar mode would cause current filaments. Due to the positive temperature efficient current filaments may result in locally increased current densities which may irreversible damage the lattice of the semiconductor material.

Since the rectifying device 560 conducts a forward current only for the desaturation period, which is a partial period of the off-time of the electric assembly 500, or if the reverse current $I_R$ is low, overall power consumption in the rectifying device 560 is low and the active area of the rectifying device 560 can be small. Small, cost-effective SiC diodes may be used to significantly improve the efficiency of low-cost silicon RC-IGBTs.

Figure 4A:
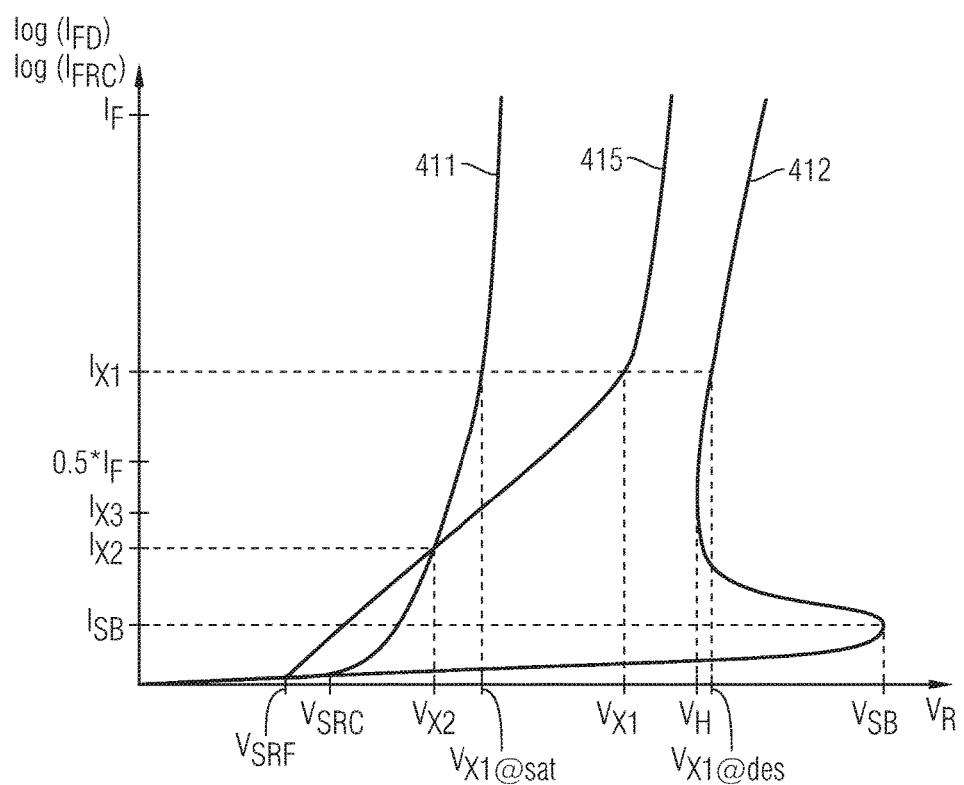
FIG. 4A is a schematic diagram showing the I/V characteristics of a switching device and a rectifying device of an electric assembly according to an embodiment with the diode I/V characteristic of the rectifying device showing a cut-in voltage.

FIG. 4A refers to an embodiment of the electric assembly 500 of FIG. 1A with a rectifying device 560 with a unipolar portion dominating the diode I/V characteristic 415 below a cut-off voltage $V_{X1}$ and below a cut-off diode forward current $I_{X1}$. Above the cut-off voltage $V_{X1}$ and the cut-off diode forward current $I_{X1}$, a bipolar portion gets more dominant and supersedes or superimposes to the I/V characteristic of the unipolar portion. For reverse voltages $V_R$ greater than $V_{X1}$ the slope of the diode I/V characteristic is significantly steeper than for reverse voltages $V_R$ below the cut-off voltage $V_{X1}$. The cut-off voltage $V_{X1}$ is higher than a voltage drop $V_{X1@sat}$ across the switching device in the saturated mode with the transistor cells for desaturation turned off and lower than a voltage drop $V_{X1@des}$ across the desaturating switching device 510 with the transistor cells for desaturation turned on at $I_{FRC}$ equal to $I_{FD}$, respectively.

According to an embodiment type, layout, dimensions, dopant concentration and dopant gradients in the rectifying device 560 are selected such that the cut-off current $I_{X1}$ is between $0.1*I_F$ and $I_F$, e.g., between $0.1*I_F$ and $2*I_F$ and at the cut-off current $I_{X1}$ the voltages across the saturated and the desaturated reverse biased switching device 510 hold a distance of at least 200 mV, 500 mV, 1V or 2V to the cut-off voltage $V_{X1}$ such that the diode I/V characteristic 415 can meet all conditions as outlined for FIGS. 3A to 3C in combination. The unipolar portion may include a Schottky contact, an ohmic contact, a gated channel, or any combination thereof.

In FIG. 4B the diode I/V characteristic 415a at 25° C. has a cut-off voltage $V_{Xa}$ at 25° C. close to the voltage drop across the reverse biased switching device with the transistor cells TC for desaturation turned on such that the diode I/V characteristic 415a at 25° C. intersects the desaturation I/V characteristic 412 of the switching device at a reverse current through the switching device below the nominal diode forward current $I_F$, e.g., below twice or below four times the nominal diode forward current $I_F$. Both the reverse biased switching device 510 and the forward biased rectifying device 560 can contribute to conveying a high pulse current or an overload condition of the application. Ohmic resistance is minimized such that the electric assembly 500 shows high ruggedness against overload conditions. According to an embodiment the rectifying device 560 is a SiC diode and includes a unipolar portion and a bipolar portion. Rectifying devices based on silicon carbide show a strong temperature dependency.

In addition to the diode I/V characteristic 415a for a case temperature of, e.g., 25° C. FIG. 4B shows a diode IN characteristic 415b for a case temperature of, e.g., 175° C. According to an embodiment, the cut-off voltage $V_{x1}$ may decrease with increasing temperature such that the diode I/V characteristic 415b intersects the desaturation I/V characteristic 412 of the reverse-biased switching device 510 before the temperature of the rectifying device 560 exceeds a critical temperature. In this case the switching device 510 takes a portion of the current through the rectifying device 560 such that the rectifying device 560 does not heat up further. As a consequence, the rectifying device 560, for example, a SiC desaturation diode may be provided with only a low safety margin such that a low-cost SiC diode with small active area can be used. Despite of that at an overcurrent condition heats up such diode quickly, the SiC diode is safe from being destroyed, because the electric assembly 500 falls in a safety mode that results from that the switching device 510, which typically is defined with great safety margins, takes most of the current.

Figure 5A:
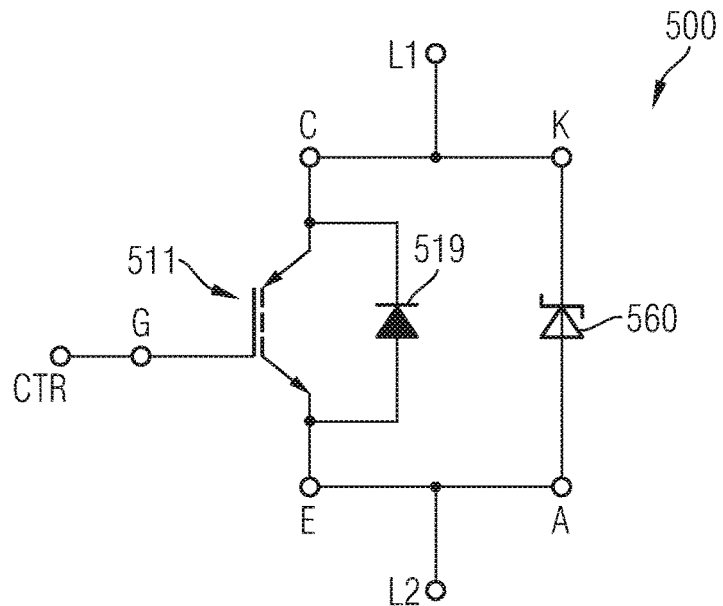
FIG. 5A is a schematic circuit diagram of an electric assembly according to an embodiment including an RC-IGBT and a desaturation diode that includes a Schottky contact, an ohmic contact, or a gated channel.

The electric assembly 500 illustrated in FIG. 5A includes an RC-IGBT 511, e.g., an Si-RCDC (silicon RC-IGBT with diode control) and a rectifying device 560 electrically arranged anti-parallel to the RC-IGBT 511. The rectifying device 560 is effective as auxiliary diode that increases efficiency of desaturation of the reverse biased RC-IGBT 511, improves low-current conductivity of the reverse-biased electric assembly 500, and/or attenuates the effect of snapback in the reverse-biased RC-IGBT 511 on the circuit environment.

A collector terminal C of the RC-IGBT 511 forms or is electrically connected to the first load terminal L1, an emitter terminal E forms or is electrically connected to the second load terminal L2 and a gate terminal G forms or is electrically coupled or connected to the control terminal CTR of the electric assembly 500. The RC-IGBT 511 integrates a body diode 519 which is spatially merged with transistor cells of the RC-IGBT 511. A control signal applied to the gate terminal G turns on and off the transistor cells of the RC-IGBT 511.

A cathode terminal of the rectifying device 560 is directly electrically connected to the first load terminal L1, to the collector electrode C or to both. An anode terminal A of the rectifying device 560 is directly electrically connected to the second load terminal L2, to the emitter electrode E or to both. A semiconductor portion of the rectifying device 560 may be based on silicon carbide SiC.

Figure 5B:
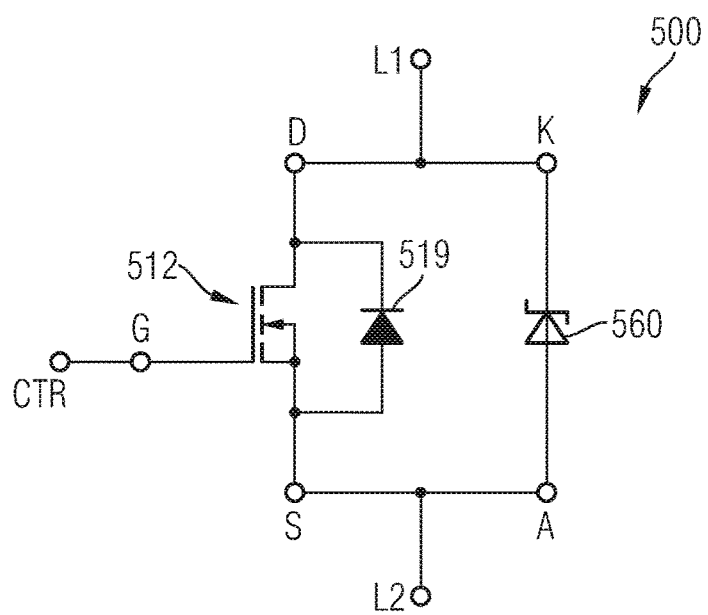
FIG. 5B is a schematic circuit diagram of an electric assembly according to an embodiment including an IGFET and a desaturation diode that includes a Schottky contact, an ohmic contact, or a gated channel.

In FIG. 5B the electric assembly 500 includes an IGFET 512 with integrated body diode 519 and a rectifying device 560, wherein the rectifying device 560 is electrically arranged anti-parallel to the IGFET 512 and effective as auxiliary diode as described above.

Figure 6:
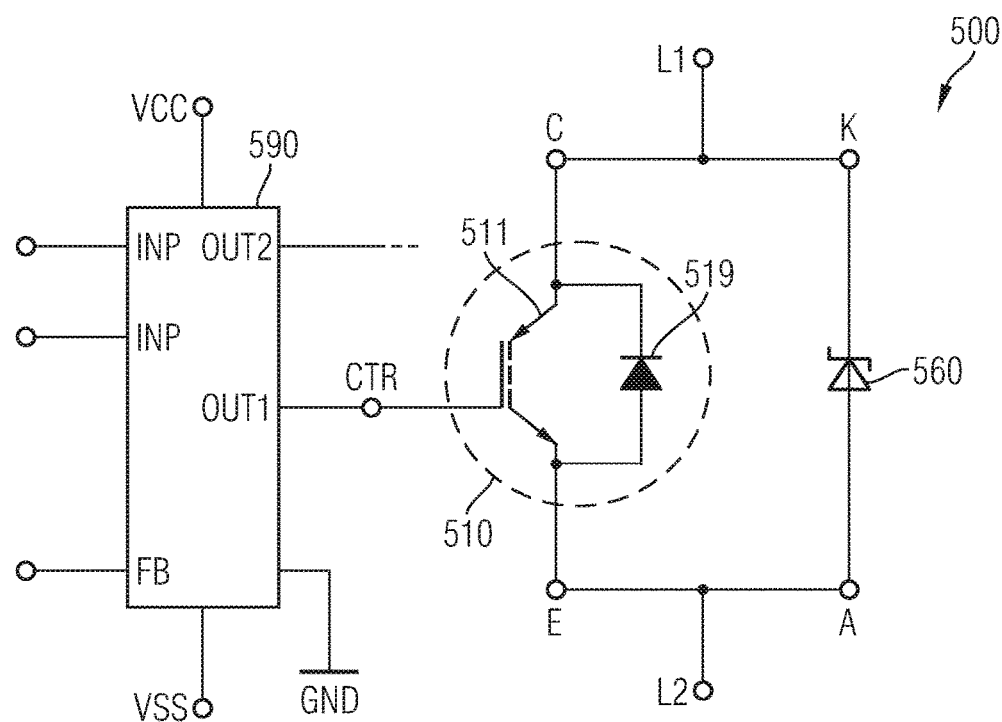
FIG. 6 is a schematic circuit diagram of an electric assembly according to an embodiment including a control circuit.

FIG. 6 shows an electric assembly 500 that includes an RC-IGBT 511, a rectifying device 560 electrically arranged anti-parallel to the RC-IGBT 511, and a control circuit 590 for controlling the RC-IGBT 511. The rectifying device 560 is a diode, wherein type, layout, dimensions, dopant concentrations and dopant gradients are selected such that the diode IN characteristic fulfills at least one of the conditions as outlined above.

A first control output OUT1 of the control circuit 590 is electrically connected to the control input CTR of the electric assembly 500. The electric assembly 500 may be or may be part of the low-side switch or of the high-side switch in a half-bridge circuit. The control circuit 590 may include a second control output OUT2 for controlling a further electronic assembly that forms or that is part of the complementary switch in the half-bridge circuit.

The control circuit 590 generates and outputs a control signal, e.g., a square signal at the first control output OUT1, wherein the level of the control signal controls the on and off periods of transistor cells of the RC-IGBT 511 under forward and under reverse bias. For example, a high level of the control signal close to VCC may turn on the RC-IGBT 511 and a low level of the control signal close to, e.g., GND or VEE may turn off the RC-IGBT 511.

In addition, the control circuit 590 may generate and output a desaturation pulse of predefined duration at the end of a reverse bias cycle of the electric assembly 500. The desaturation pulse is applied to the control input CTR of the electric assembly 500 at a predefined point in time before a bias across the electric assembly 500 changes from reverse to forward. The desaturation pulse turns on gated channels for desaturation, e.g., transistor cells provided only for desaturation or some or all of the transistor cells that control the load current under forward bias.

The length of a desaturation pulse may depend on the switching frequency at which the control circuit 590 turns on and off the RC-IGBT 511. A safety period between the end of the desaturation pulse and the predicted start of commutation including the change from reverse bias to forward bias may be in the range from some hundred nanoseconds up to several microseconds. The rectifying device 560 is a diode, wherein type, layout, dimensions, dopant concentrations and dopant gradients are selected such that the diode I/V characteristic fulfills at least one of the conditions as outlined above.

The control circuit 590 may include further input terminals INP that allow a higher control instance, e.g., a processor circuit to control the control circuit 590. One or more feedback terminals FB may receive a signal or signals descriptive for load and/or source conditions such that the control circuit 590 may adjust duty cycle and/or switching frequency of the electric assembly 500 to varying load or source conditions.

FIGS. 7A to 7D refer to embodiments of the rectifying device 560 of FIG. 1A, wherein the rectifying device 560 includes a unipolar portion mainly defining a shallow section of the diode I/V characteristic 415 below or above a cut-in voltage $V_{X1}$ and a bipolar portion mainly defining a steep section of the diode I/V characteristic 415 above or below the cut-in voltage $V_{X1}$.

The shallow section of the diode I/V characteristic 415 may be dominated by unipolar current, e.g., through a Schottky contact, an ohmic contact or a gated channel. In the steep section of the diode I/V characteristic 415 a bipolar current through a pn junction may supersede or may superimpose to the unipolar current.

Semiconducting regions of the rectifying device 560 of FIG. 1A are formed in a semiconductor portion 100 that includes an anode structure 110 at a front side along a first surface 101 and a cathode structure 120 at a back side along a second surface 102 parallel to and opposite of the first surface 101. A metal anode electrode 310 is electrically connected to and may form ohmic contacts with heavily doped anode zones 111 of the anode structure 110 at the front side. A metal cathode electrode 320 is directly connected to the cathode structure 120 at the back side. The cathode structure 120 includes a heavily doped contact portion 129 forming an ohmic contact with the metal cathode electrode 320. A lightly doped drift zone 121 is formed between, e.g., may separate the contact portion 129 from the anode structure 110 and may form pn junctions pn0 with the anode zones 111. The semiconductor portion 100 may be from silicon, germanium, silicon carbide, gallium arsenide or gallium nitride, by way of example.

Figure 7A:
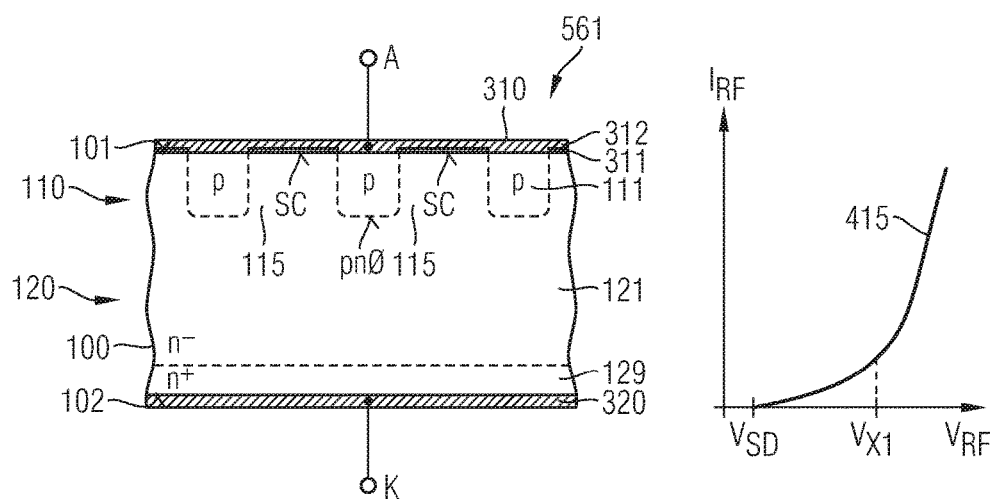
FIG. 7A includes a schematic vertical cross-sectional view of a portion of a desaturation diode on the basis of an SiC-MPS (merged pin Schottky) diode according to an embodiment and a schematic diagram illustrating the I/V characteristic of the desaturation diode under forward bias.

FIG. 7A refers to an MPS diode 561 that includes separated anode zones 111 extending from the first surface 101 into the cathode structure 120, e.g., into the drift zone 121. The anode zones 111 may be stripe-shaped with one horizontal dimension significantly exceeding the second horizontal dimension orthogonal to the first horizontal dimension, may be dot-shaped with both horizontal dimensions within the same order of magnitude or may form a grid, e.g., a hexagonal grid. Between neighboring anode zones 111 channel portions 125 of the cathode structure 120 directly adjoin to the metal anode electrode 310 and form Schottky contacts SC with the metal anode electrode 310. The metal anode electrode 310 may include Schottky contact portions 311, which directly adjoin which includes or is from titanium (Ti), and a main portion 312, which may include or may be from aluminum. The Schottky contact portions 311 directly adjoin the channel portions 125 and the main portion 312 forms ohmic contacts to the anode zones 111.

Under low forward bias $V_R$ that exceeds a set voltage $V_{SD}$ of the Schottky contacts SC, the Schottky contacts SC convey a unipolar forward current $I_{RF}$. With increasing diode forward current $I_{RF}$, a voltage drop along the pn junctions pn0 increases. Above a cut-in voltage $V_{X1}$ at which the voltage drop along the pn junctions pn0 exceeds the set-in voltage of the pn junctions pn0, i.e., the material-specific built-in potential of the pn junctions pn0, a bipolar current through the forward biased pn junctions pn0 gradually adds to the current through the Schottky contacts SC such that the diode I/V characteristic 415 gets steeper. The MPS diode 561 can be designed to fulfill at least two of the conditions described with reference to FIGS. 3A to 3C in combination.

Figure 7B:
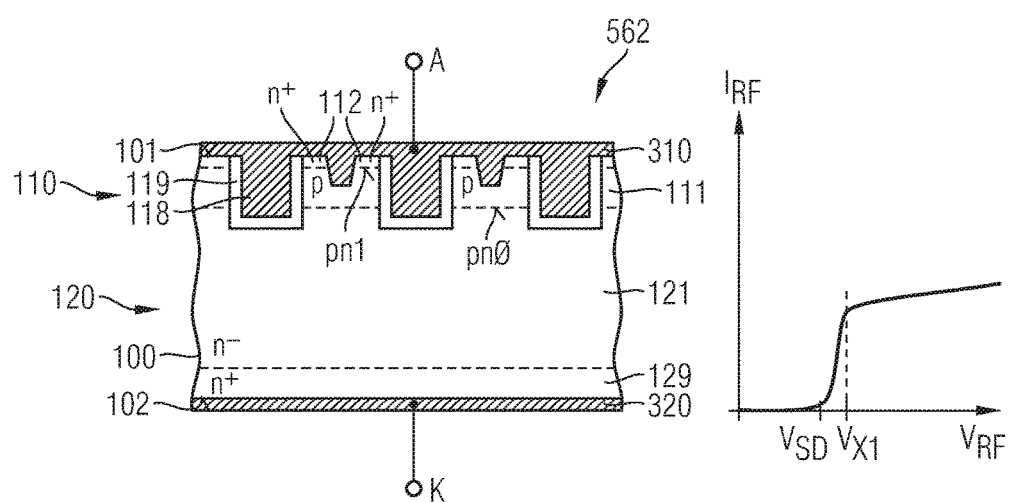
FIG. 7B includes a schematic vertical cross-sectional view of a desaturation diode on the basis of an MGD (MOS gated diode) according to an embodiment and a schematic diagram illustrating the I/V characteristic of the desaturation diode under forward bias.

In FIG. 7B an MGD 562 includes anode zones 111 forming pn junctions pn0 with the cathode structure 120 and further pn junction pn1 with source zones 112, wherein the anode zones 111 separate the source zones 112 from the cathode structure 120. The source zones 112 are formed between the first surface 101 and the anode zones 111.

Trench gate structures extend from the first surface 101 to at least the cathode structure 120. The trench gate structures include a gate electrode 118, which is insulated from the semiconducting material of the semiconductor portion 100, and a gate dielectric 119 that separates the gate electrode 118 at least from the anode zones 111.

The gate electrode 118, the anode zones 111 and the source zones 112 are electrically connected through low-ohmic connections and/or through the metal anode electrode 310, which may be formed along the first surface 101.

Due to the resistivity of the anode zones 111, any current flow through the anode zones 111 may reduce the potential in the anode zones 111 to below the potential of the metal anode electrode 310 and a positive potential difference may build up between the gate electrode 118 and the anode zones 111 despite that the gate electrode 118 and the anode zones 111 are directly connected to the metal anode electrode 310. The potential difference increases with increasing current flow through the anode zones 111 such that above a cut-in voltage $V_{X1}$ inversion channels build up along the gate dielectric 119 through the anode zones 111.

As a consequence, the diode I/V characteristic 415 of the MGD 562 can be extremely steep between a built-in voltage of, e.g., 0.6 V and a cut-in voltage $V_{X1}$ of, e.g., 2 V. Beyond the cut-in voltage $V_{X1}$ the current flow is almost unipolar resulting in a shallow, approximately linear increase of the diode reverse current $I_{RF}$. The diode I/V characteristic 415 of the MGD 562 can be designed to fulfill at least the conditions for the low-current operation mode as discussed in FIG. 3B.

FIG. 7C refers to a TOPS diode 563. The anode structure 110 includes conductive plugs 117, e.g., doped polysilicon plugs extending from the first surface 101 into the drift zone 121 and forming ohmic contacts with a main portion 312 of the metal anode electrode 310. Insulator structures 116 line vertical sidewalls of the conductive plugs 117. The anode zones 111 are formed in the vertical projection of the conductive plugs 117. The insulator structures 116 prevent the diffusion of p-type dopants in a lateral direction and facilitate the formation of the anode zones 111 in a distance to the first surface 101.

Channel portions 125 of the cathode structure 120 form Schottky contacts SC with Schottky contact portions 311 of the metal anode electrode 310 between neighboring conductive plugs 117. Due to the lower set-in voltage $V_{SD}$ of the Schottky contacts SC, at first a unipolar forward current flows under forward bias. With increasing forward current a voltage drop along the pn junctions pn0 increases and may finally trigger charge carrier injection along the pn junctions pn0 at a cut-in voltage $V_{X1}$.

In the IDEE diode 564 of FIG. 7D channel portions 125 of the cathode structure 120 extend between the anode zones 111 and form unipolar homojunctions with heavily doped channel contact zones 112 that form ohmic contacts with the metal anode electrode 310. Dopant concentrations and dimensions of both the anode zones 111 and the channel portions 125 may be selected such that an electric field fully depletes the channel portions 125 from mobile charge carriers under reverse bias such that reverse leakage current is low.

Under low forward bias, the ohmic contacts of the channels 138 convey a bipolar current. With increasing forward current, a voltage drop along the pn junctions pn0 between the drift zone 121 and the anode zones 111 increases. Above a cut-in voltage $V_{X1}$ at which the voltage drop along the pn junctions pn0 exceeds the set-in voltage of the pn junctions pn0, i.e., the specific built-in potential of the pn junctions pn0, an additional current through the forward biased pn junctions gradually adds to the current through the ohmic contacts such that the diode I/V characteristic 415 gets steeper with increasing forward current. Due to the ohmic nature, the IDEE conducts a low reverse current at low reverse voltage such that losses for low-current operation are low.

Figure 8:
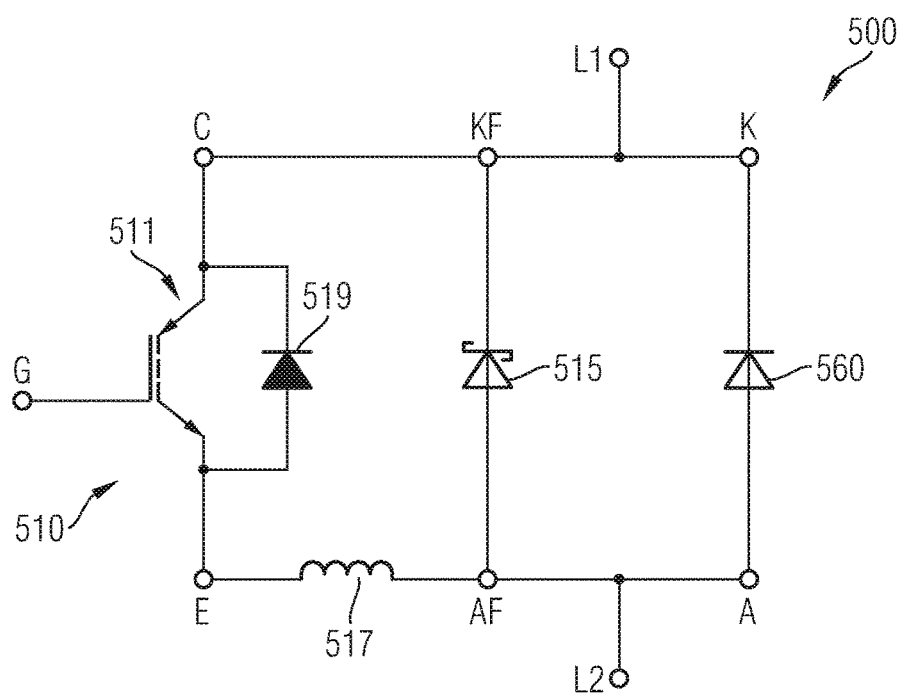
FIG. 8 is a schematic circuit diagram of an electric assembly according to an embodiment including a silicon RC-IGBT, an SiC desaturation diode, and an SiC clamping diode.

In FIG. 8, the electric assembly 500 includes a clamping diode 515 with a breakdown voltage lower than a breakdown voltage of an auxiliary diode used as rectifying device 560 and lower than a breakdown voltage of the body diode 519 of the RC-IGBT 511. An overvoltage condition triggers an avalanche breakdown only in the clamping diode 515 such that the clamping diode 515 may protect the RC-IGBT 511 and the rectifying device 560 against overvoltage. The clamping diode 515 may be designed for high avalanche ruggedness such that design constraints for the auxiliary diode are relaxed in this respect. Both the clamping diode 515 and the auxiliary diode may be diodes showing a cut-in voltage $V_{X1}$. For example, both the clamping diode 515 and the auxiliary diode may be SiC MPS diodes, wherein the avalanche breakdown in the clamping diode 515 generates electron/hole pairs such that the reverse current is high and the clamping diode 515 effectively protects the silicon RC-IGBT 511 against overvoltage.

The electric assembly 500 may also include an inductive element 517 between terminals of the rectifying device 560 and the switching device 510, for example between the anode terminal AF of the clamping diode 515 and the emitter terminal E of the RC-IGBT 511. The inductive element 517 may be a portion of a bond wiring, a loop in a strip conductor or a discrete inductive element bridging a gap in a strip conductor between the anode terminal AF of the clamping diode 515 and the emitter terminal E of the RC-IGBT 511. The inductive element 517 may delay a takeover of a reverse current from the rectifying device 560 to the RC-IGBT 511 after the desaturation cycle of the RC-IGBT 511.

The electric assemblies 500 illustrated in FIGS. 9A and 9B include a carrier board 599, e.g., a PCB (printed circuit board) or DCB (directly copper bonding) board. At least a first conductor structure 591 and a second conductor structure 592 are formed on a mounting surface of the carrier board 599. The first conductor structure 591 forms or is electrically connected to a first load terminal L1. The second conductor structure 592 forms or is electrically connected to a second load terminal L2. The first and second conductor structures 591, 592 may be copper pads or copper strips.

A silicon RC-IGBT 511, a clamping diode 515 and an auxiliary diode effective as the rectifying device 560 of FIG. 1A are mounted, e.g., soldered or bonded side-by-side on the first conductor structure 591, wherein the cathodes of the auxiliary diode and the clamping diode 515 as well as the collector of the silicon RC-IGBT 511 directly contact the first conductor structure 591. Bond wirings 586 electrically connect the exposed anode terminal AF of the clamping diode 515 and the exposed anode terminal A of the auxiliary diode with the second conductor structure 592.

In FIG. 9A the inductance of the bond wiring 586 between the desaturation diode and the second conductor structure 592 may be increased by reducing the number of bond wires in the bond wiring 586 between the desaturation diode and the second conductor structure 592, by lengthening the bond wires or by forming the bond wires from another material. The increased inductance may further delay the recovery of the charge carrier plasma after desaturation.

In FIG. 9B a loop 587 in the second conductor structure 592 between the silicon RC-IGBT 511 and the rectifying device 560 may increase the stray inductance between the desaturation diode and the silicon RC-IGBT.

Figure 10:
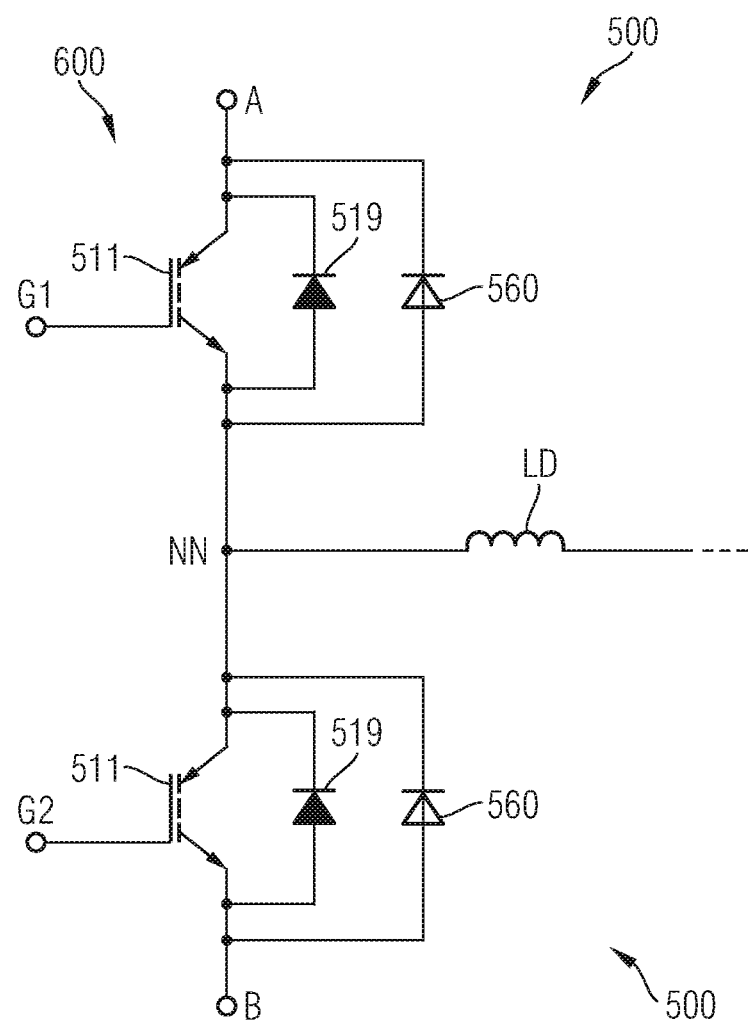
FIG. 10 is a schematic diagram of a half bridge circuit including SiC desaturation diodes parallel to silicon RC-IGBTs according to a further embodiment.

FIG. 10 refers to a portion of an electronic assembly 600 that may be a motor drive, a switched mode power supply, a primary stage of a switched mode power supply, a synchronous rectifier, a primary stage of a DC/AC converter, a secondary stage of a DC/AC converter, a primary stage of a DC/DC converter, or a portion of a solar power converter, by way of example.

The electronic assembly 600 may include two identical electric assemblies 500 as described above arranged as low-side switch and high-side switch in a half-bridge configuration. The electric assemblies 500 may include silicon RC-IGBTs 511 with body diodes 519 and anti-parallel rectifying devices 560 effective as auxiliary diodes as described above. The load paths of the two electric assemblies 500 are electrically connected in series between a first supply terminal A and a second supply terminal B. The supply terminals A, B may supply a DC (direct-current) voltage or an AC (alternating-current) voltage. An intermediate network node NN between the two electric assemblies 500 may be electrically connected to an inductive load LD, which may be a winding of a transformer or a motor winding, or to a reference potential of an electronic circuit, by way of example.

The electronic assembly 600 may be a motor drive with the electric assemblies 500 electrically arranged in a half-bridge configuration, the network node NN electrically connected to a motor winding and the supply terminals A, B supplying a DC voltage.

According to another embodiment, the electronic assembly 600 may be a primary side stage of a switched mode power supply with the supply terminals A, B supplying an AC voltage of an input frequency to the electronic assembly 600. The network node NN is electrically connected to a primary winding of a transformer.

The electronic assembly 600 may be a synchronous rectifier of a switched mode power supply with the supply terminals A, B connected to a secondary winding of the transformer and the network node NN electrically connected to a reference potential of an electronic circuit at the secondary side of the switched mode power supply.

According to a further embodiment, the electronic assembly 600 may be a primary side stage of a DC/DC converter, e.g., a power optimizer or a micro-inverter for applications including photovoltaic cells with the supply terminals A, B supplying a DC voltage to the electronic assembly 600 and the network node NN electrically connected to an inductive storage element.

According to another embodiment, the electronic assembly 600 may be a secondary side stage of a DC/DC converter, e.g., a power optimizer or a micro-inverter for applications including photovoltaic cells, wherein the electronic assembly 600 supplies an output voltage to the supply terminals A, B and wherein the network node NN is electrically connected to the inductive storage element.

Figure 11:
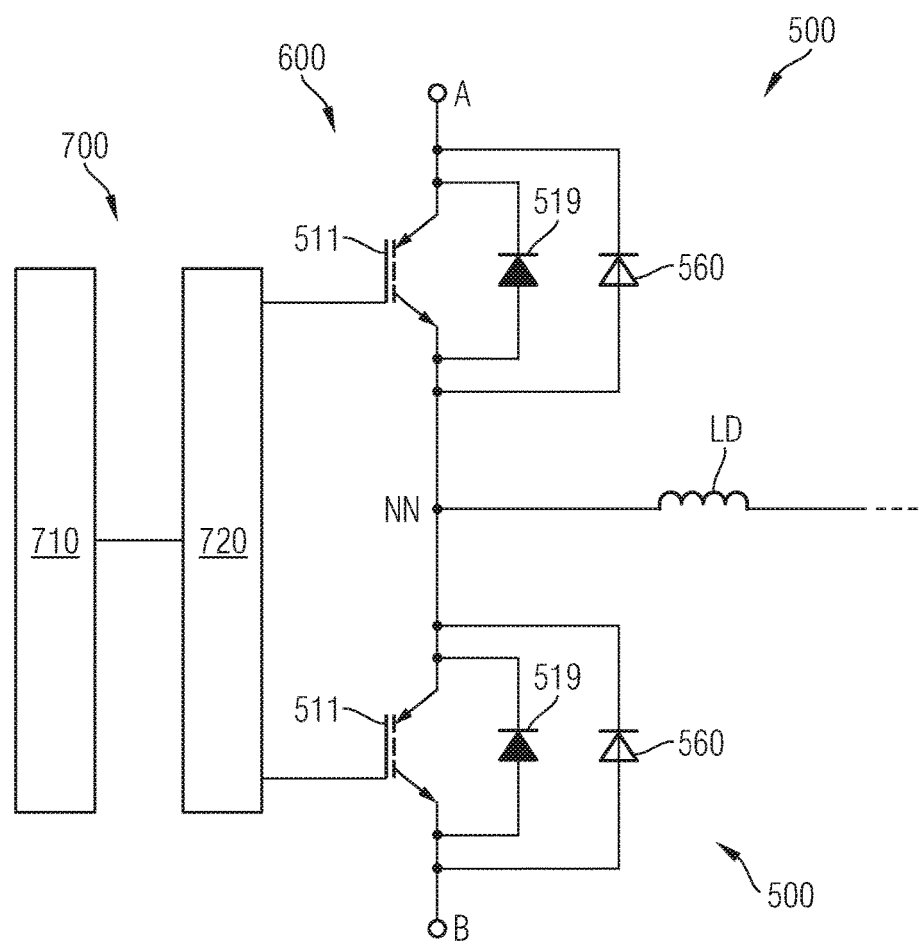
FIG. 11 is a schematic diagram of a smart IGBT module including SiC desaturation diodes parallel to silicon RC-IGBTs according to a further embodiment.

FIG. 11 refers to an IGBT module 700 including the electronic assembly 600 of FIG. 10. The IGBT module 700 may further include a gate control circuit 710 configured to supply a control signal for alternately switching on and off the electronic assembly 600 and a gate driver 720 controlled by the gate control circuit 710 and electrically connected to gate terminals of the electronic assembly 600.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electric assembly, comprising:
   a reverse conducting switching device comprising transistor cells for desaturation, wherein the transistor cells for desaturation are configured to be, under reverse bias, turned on in a desaturation mode and to be turned off in a saturation mode; and
   a rectifying device electrically connected anti-parallel to the switching device, wherein in a range of a diode forward current from half of a maximum rating diode current of the switching device to the maximum rating diode current, a diode I/V characteristic of the rectifying device shows a voltage drop across the rectifying device higher than a saturation I/V characteristic of the switching device with the transistor cells for desaturation turned off and lower than a desaturation I/V characteristic of the switching device with the transistor cells for desaturation turned on.

2. The electric assembly of claim 1, wherein the switching device is a reverse conducting IGBT.

3. The electric assembly of claim 1, wherein the rectifying device is adapted to convey a unipolar forward current at a forward bias of the rectifying device below a cut-off voltage and to convey a bipolar forward current at a forward bias of the rectifying device above the cut-off voltage, wherein the cut-off voltage is higher than a voltage drop across the switching device with the transistor cells for desaturation turned off and lower than a voltage drop across the switching device with the transistor cells for desaturation turned on at equal reverse current and diode forward current.

4. The electric assembly of claim 1, wherein within a nominal operating range of the switching device the diode I/V characteristic of the forward biased rectifying device does not intersect the desaturation I/V characteristic of the switching device under reverse bias with the transistor cells for desaturation turned on.

5. The electric assembly of claim 1, wherein the diode I/V characteristic of the forward biased rectifying device intersects the saturation I/V characteristic of the switching device under reverse bias with the transistor cells for desaturation turned off within a nominal operating range of the switching device.

6. The electric assembly of claim 1, wherein the rectifying device is a merged pn Schottky diode, wherein a pn junction of the merged pn Schottky diode starts to inject charge carriers at a forward bias of the rectifying device at or above a cut-off voltage, wherein the cut-off voltage is higher than a voltage drop across the switching device with the transistor cells for desaturation turned off and lower than a voltage drop across the switching device with the transistor cells turned on at equal reverse current and forward diode current.

7. The electric assembly of claim 6, wherein the cut off voltage decreases with increasing temperature.

8. The electric assembly of claim 1, wherein the rectifying device is an inverse-injection-dependency-of-emitter-efficiency-diode, wherein a pn junction of the inverse injection dependency of emitter efficiency diode starts to inject charge carriers at a forward bias of the rectifying device at or above a cut-off voltage, wherein the cut-off voltage is higher than a voltage drop across the switching device with the transistor cells turned off and lower than a voltage drop across the switching device with the transistor cells turned on at equal reverse current and forward diode current.

9. The electric assembly of claim 1, further comprising:
a control circuit comprising a control output terminal electrically connected to a control terminal of the switching device, wherein the control circuit is adapted to generate a desaturation signal and to output the desaturation signal at the control output terminal at a point in time preceding a change of a voltage bias across load terminals of the electric assembly from reverse to forward.

10. The electric assembly of claim 1, wherein
a semiconductor portion of the rectifying device is from silicon carbide.

11. An electric assembly, comprising:
a reverse conducting switching device comprising transistor cells for desaturation, wherein the transistor cells for desaturation are configured to be, under reverse bias, turned on in a desaturation mode and to be turned off in a saturation mode; and
a rectifying device electrically connected anti-parallel to the switching device, wherein for a reverse voltage across the electric assembly below a threshold voltage a diode forward current of the rectifying device is higher than a reverse current through the switching device and for a reverse voltage above the threshold voltage the diode forward current through the rectifying device is lower than the reverse current through the switching device with the transistor cells for desaturation turned off.

12. The electric assembly of claim 11, wherein
the rectifying device is adapted to convey a unipolar forward current at a forward bias of the rectifying device below a cut-off voltage and to convey a bipolar forward current at a forward bias of the rectifying device above the cut-off voltage, wherein the cut-off voltage is higher than a voltage drop across the switching device with the transistor cells for desaturation turned off and lower than a voltage drop across the switching device with the transistor cells for desaturation turned on at equal reverse current and forward diode current.

13. The electric assembly of claim 11, wherein
a set-in voltage of the rectifying device is lower than a set-in voltage of the switching device under reverse bias.

14. The electric assembly of claim 11, wherein
the rectifying device comprises a Schottky contact.

15. The electric assembly of claim 14, wherein
the Schottky contact comprises an interface between a semiconductor material and molybdenum.

16. The electric assembly of claim 11, wherein
the rectifying device is a merged pn Schottky diode, wherein a pn junction of the merged pn Schottky diode starts to inject charge carriers at a forward bias of the rectifying device above a cut-off voltage, wherein the cut-off voltage is higher than a voltage drop across the switching device with the transistor cells for desaturation turned off and lower than a voltage drop across the switching device with the transistor cells for desaturation turned on at equal reverse current and forward diode current.

17. The electric assembly of claim 11, wherein
the rectifying device is an inverse-injection-dependency-of-emitter-efficiency-diode, wherein a pn junction of the inverse-injection-dependency-of-emitter-efficiency-diode starts to inject charge carriers at a forward bias of the rectifying device above a cut-off voltage, wherein the cut-off voltage is higher than a voltage drop across the switching device with the transistor cells for desaturation turned off and lower than a voltage drop across the switching device with the transistor cells for desaturation turned on at equal reverse current and forward diode current.

18. The electric assembly of claim 11, wherein
the rectifying device is a MOS gated diode.

19. The electric assembly of claim 11, wherein
a semiconductor portion of the rectifying device is of a wide-bandgap material.

20. The electric assembly of claim 11, wherein
a semiconductor portion of the rectifying device is from silicon carbide.

* * * * *